United States Patent
Liu et al.

(10) Patent No.: US 10,083,832 B1
(45) Date of Patent: Sep. 25, 2018

(54) UNDER LAYER COMPOSITION AND METHOD OF MANUFACTURING SEMICONDUCTOR DEVICE

(71) Applicant: Taiwan Semiconductor Manufacturing Co., Ltd., Hsinchu (TW)

(72) Inventors: Chen-Yu Liu, Kaohsiung (TW); Chin-Hsiang Lin, Hsin-Chu (TW); Ching-Yu Chang, Yilang County (TW); Ming-Hui Weng, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/468,109

(22) Filed: Mar. 24, 2017

(51) Int. Cl.
| | |
|---|---|
| *H01L 21/02* | (2006.01) |
| *H01L 21/027* | (2006.01) |
| *H01L 21/311* | (2006.01) |
| *C09D 201/06* | (2006.01) |
| *G03F 7/11* | (2006.01) |
| *G03F 7/16* | (2006.01) |
| *G03F 7/09* | (2006.01) |

(52) U.S. Cl.
CPC ........ *H01L 21/0276* (2013.01); *C09D 201/06* (2013.01); *G03F 7/091* (2013.01); *G03F 7/11* (2013.01); *G03F 7/162* (2013.01); *G03F 7/168* (2013.01); *H01L 21/31144* (2013.01)

(58) Field of Classification Search
CPC .................. H01L 21/31144; H01L 21/0276
See application file for complete search history.

(56) References Cited

U.S. PATENT DOCUMENTS

| | | |
|---|---|---|
| 8,796,666 B1 | 8/2014 | Huang et al. |
| 9,012,132 B2 | 4/2015 | Chang |
| 9,093,530 B2 | 4/2015 | Huang et al. |
| 9,028,915 B2 | 5/2015 | Chang et al. |
| 9,146,469 B2 | 9/2015 | Liu et al. |
| 9,213,234 B2 | 12/2015 | Chang |
| 9,223,220 B2 | 12/2015 | Chang |
| 9,256,133 B2 | 2/2016 | Chang |
| 9,536,759 B2 | 1/2017 | Yang et al. |
| 9,548,303 B2 | 1/2017 | Lee et al. |
| 2011/0076626 A1* | 3/2011 | Padmanaban ........... G03F 7/091 430/326 |
| 2011/0086312 A1* | 4/2011 | Dammel ................ G03F 7/091 430/285.1 |

* cited by examiner

*Primary Examiner* — Seahvosh Nikmanesh
(74) *Attorney, Agent, or Firm* — JCIPRNET

(57) ABSTRACT

Under layer composition and methods of manufacturing semiconductor devices are disclosed. The method of manufacturing semiconductor device includes the following steps. A layer of an under layer composition is formed, wherein the under layer composition includes a polymeric material and a cross-linker, and the cross-linker includes at least one decomposable functional group. A curing process is performed on the layer of the under layer composition to form an under layer, wherein the cross-linker is crosslinked with the polymeric material to form a crosslinked polymeric material having the at least one decomposable functional group. A patterned photoresist layer is formed over the under layer. An etching process is performed to transfer a pattern of the patterned photoresist layer to the under layer. The under layer is removed by decomposing the decomposable functional group.

20 Claims, 9 Drawing Sheets

UNDER LAYER COMPOSITION AND METHOD OF MANUFACTURING SEMICONDUCTOR DEVICE

BACKGROUND

Photolithography (or lithography) is frequently used in manufacturing semiconductor integrated circuits (IC). In a typical lithography process, a resist film is spin-coated on a surface of a silicon wafer and is subsequently exposed and developed to form a pattern for etching the silicon wafer. As semiconductor fabrication technology continues to scale down where functional density has generally increased while geometry size has generally decreased, there has been a demand for a reduction in resist film thickness and a better reflectivity control during exposure. Accordingly, some new material and/or new techniques in lithography have been developed. For example, some lithography processes use silicon-containing resist over a carbon-containing bottom anti-reflective coating (BARC) layer to reduce resist film thickness. For another example, some lithography processes use a tri-layer stack that includes a resist over a silicon-containing middle layer over a carbon-containing under layer. However, these approaches present new challenges.

For example, in the tri-layer approach, the carbon-containing layer is very difficult to remove, and thus dry etch process is applied. However, when the carbon-containing layer is formed over a dielectric layer, the removal of the carbon-containing layer may damage the dielectric layer therebeneath. This unavoidably reduces device reliability.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
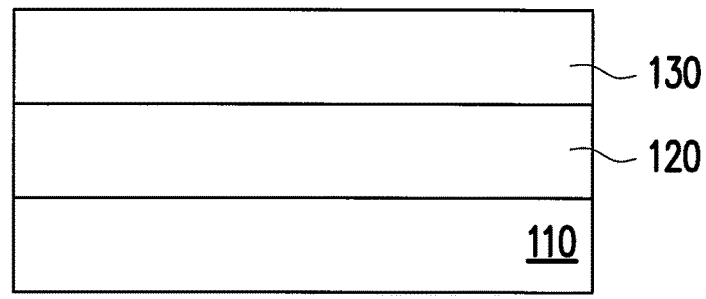
FIGS. 1A-1F are schematic cross-sectional views illustrating a method of manufacturing a semiconductor device in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

Figure 1B:
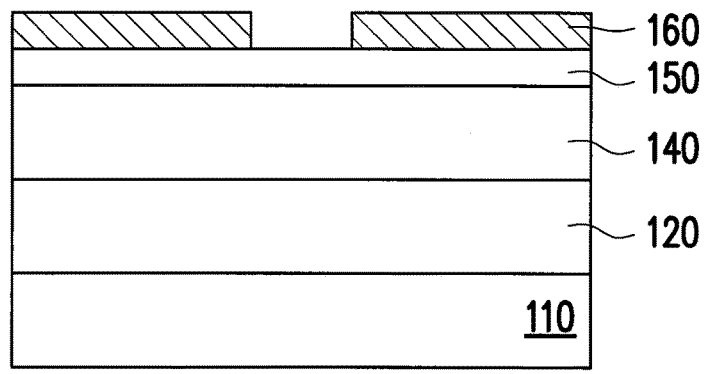

FIGS. 1A-1F are schematic cross-sectional views illustrating a method of manufacturing a semiconductor device in accordance with some embodiments of the disclosure. Referring to FIGS. 1A and 1B, an under layer 140 is formed over a dielectric layer 120. In some embodiments, the dielectric layer 120 is formed over a substrate 110, and the under layer 140 is formed over the dielectric layer 120. The substrate 110 includes a silicon substrate in some embodiments. The substrate 110 may include another elementary semiconductor, such as germanium, or diamond in some embodiments. The substrate 110 may include a compound semiconductor, such as silicon carbide, gallium arsenic, indium arsenide, and indium phosphide. The substrate 110 may include an alloy semiconductor, such as silicon germanium, silicon germanium carbide, gallium arsenic phosphide, and gallium indium phosphide. The substrate 110 may include one or more epitaxial semiconductor layer, such as semiconductor layer(s) epitaxially grown on a silicon substrate. For example, the substrate may have an epitaxial layer overlying a bulk semiconductor. Further, the substrate may be strained for performance enhancement. For example, the epitaxial layer may include semiconductor materials different from those of the bulk semiconductor such as a layer of silicon germanium overlying a bulk silicon, or a layer of silicon overlying a bulk silicon germanium formed by a process including selective epitaxial growth (SEG). Furthermore, the substrate 110 may include a semiconductor-on-insulator (SOI) structure. For example, the substrate may include a buried oxide (BOX) layer formed by a process such as separation by implanted oxygen (SIMOX). In other embodiments, the substrate 110 may include a glass such as in thin film transistor (TFT) technologies. In some embodiments, the substrate 110 may have the electric resistance less than $10^3$ ohm-meter.

In some embodiments, the substrate 110 may also include other material layers or circuit patterns formed thereover.

For example, the substrate 110 may further include one or more material layers to be patterned (by etching to remove or ion implantation to introduce dopants), such as a gate material stack to be patterned to form gates; or a semiconductor material to be patterned to form isolation trenches. In other embodiments, multiple semiconductor material layers, such as gallium arsenic (GaAs) and aluminum gallium arsenic (AlGaAs), are epitaxially grown on the substrate 110 and are patterned to form various devices, such as light-emitting diodes (LEDs). In some other embodiments, the substrate 110 includes fin active regions and three dimensional fin field-effect transistors (FinFETs) formed or to be formed thereon. The substrate 110 may include various doped features formed therein, such as doped well structure (e.g., a P-typed doped well and an N-type doped well).

In some embodiments, the dielectric layer 120 to be patterned is formed on the substrate 110. The dielectric layer 120 is patterned to form trenches for conductive lines or holes for contacts or vias, for example. In some embodiments, the dielectric layer 120 may be a low-k dielectric layer having a k value lower than 4, for example. In some embodiments, the dielectric layer 120 is a material such as, a fluorine-doped silicon dioxide, a carbon-doped silicon dioxide, a porous silicon dioxide, a porous carbon-doped silicon dioxide, a porous SiLK, a spin-on silicone based polymeric dielectric, or a spin-on organic polymeric dielectric.

Referring to FIG. 1B, the under layer 140 is formed over the dielectric layer 120. In some embodiments, a tri-layer photoresist, for example, is formed over the dielectric layer 120, and the tri-layer photoresist includes the under layer 140, a middle layer 150 over the under layer 140 and a patterned photoresist layer 160 over the middle layer 150. The under layer 140 may function as a hard mask to transfer a pattern to the dielectric layer 120. The under layer 140 may have a density higher than the BARC layer. Existing under layer is hard to remove, and the existing wet etching process is not effective to remove the under layer. A dry etching process is applied, but the dry etching process likely damages the dielectric layer or the substrate directly therebeneath. The disclosed method and the material of the under layer 140 are designed such that the under layer 140 is able to be effectively removed by mild wet condition without damage to the material layer therebeneath.

Figure 2A:
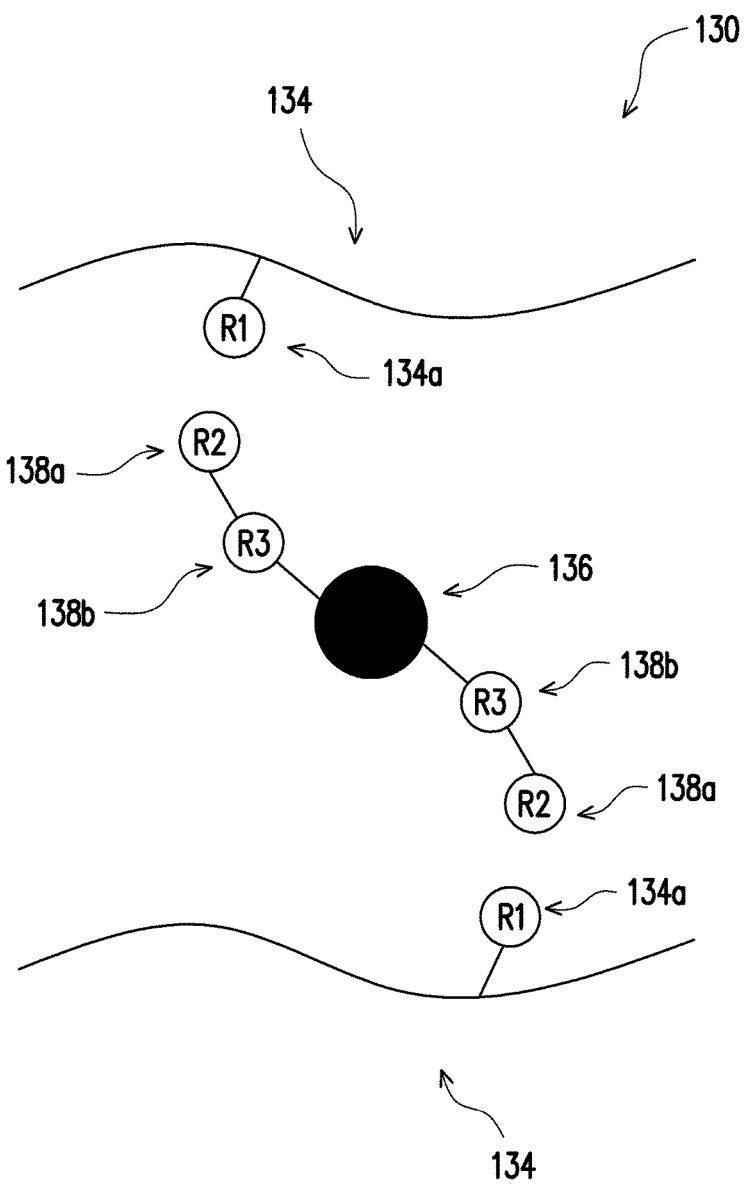
FIG. 2A is a schematic view of an under layer composition in accordance with some embodiments of the disclosure.

In some embodiments, as shown in FIGS. 1A and 1B, the formation of the under layer 140 includes spin-on coating a layer of an under layer composition 130 and curing the layer of the under layer composition 130. The under layer composition 130 used in the above-described process is further explained in association with FIG. 2A. Referring to FIG. 2A, the under layer composition 130 includes a polymeric material and a cross-linker 136. The polymeric material includes a plurality of polymers 134 which are not crosslinked with each other. Each polymer 134 includes a reaction group (R1) 134a that provides a crosslinking site and thus is capable of reacting to the cross-linker 136. Each polymer 134 may include at least one backbone unit containing carbon, hydrogen and oxygen. The backbone units can be repeated and/or combined. In some embodiments, the reaction group (R1) 134a may be selected from the group consisting of a hydroxyl group, an alkoxyl group having a carbon number less than 6, an amine group, a thiol group, a ester group, an alkene group, an alkyne group, an epoxy group, an aziridine group, an oxetane group, an aldehyde group, a ketone group, and a carboxylic acid group.

The cross-linker 136 is an organic cross-linker, for example. In some embodiments, the cross-linker 136 includes an aromatic structure, an aliphatic structure, a cycloalkyl structure, or a combination thereof. The cross-linker 136 includes at least one crosslinkable functional group (R2) 138a and at least one decomposable functional group (R3) 138b. In some embodiments, the crosslinkable functional group (R2) 138a and the decomposable functional group (R3) 138b are directly bonded.

The crosslinkable functional group (R2) 138a is capable of crosslinking with the reaction group (R1) 134a of the polymer 134 in the polymeric material. In some embodiments, the crosslinkable functional group (R2) 138a may be selected from the group consisting of a hydroxyl group, an alkoxyl group having a carbon number less than 6, an amine group, a thiol group, a ester group, an alkene group, an alkyne group, an epoxy group, an aziridine group, an oxetane group, an aldehyde group, a ketone group, and a carboxylic acid group.

The decomposable functional group (R3) 138b has weak chemical stability and thus is capable of being decomposed under a weak acid or base condition such as pH 4~10. In some embodiments, the decomposable functional group (R3) 138b may be selected from the group consisting of an ester group, an ether group, a silyl ether group, an acetal group, a ketal group, an amide group, an imine group, an imide group, and a carbamate group.

In some embodiments, the under layer composition 130 may be substantially free of silicon. The under layer composition 130 may include a photoresist (or resist) that is either a positive-type or negative-type. In some embodiments, the under layer composition 130 may further include an additives and/or a dye. The additive may include various chemicals designed to modify the characteristics and enhance of the performance of the under layer composition 130. In some embodiments, the additives include surfactant, fluoro-containing groups, or both. The dye is sensitive to light and is able to modify the characteristics (such as refractive index n and extinction coefficient κ) of the under layer 140. In some embodiments, the under layer composition 130 also includes solvent when it is disposed over the substrate 110. In various example, the solvent includes isopropyl alcohol (IPA), propylene glycol methyl ether (PGEE), propylene glycol monomethyl ether acetate (PGMEA), $H_2O$, ether, alcohol, ketone, or ester.

Figure 2B:
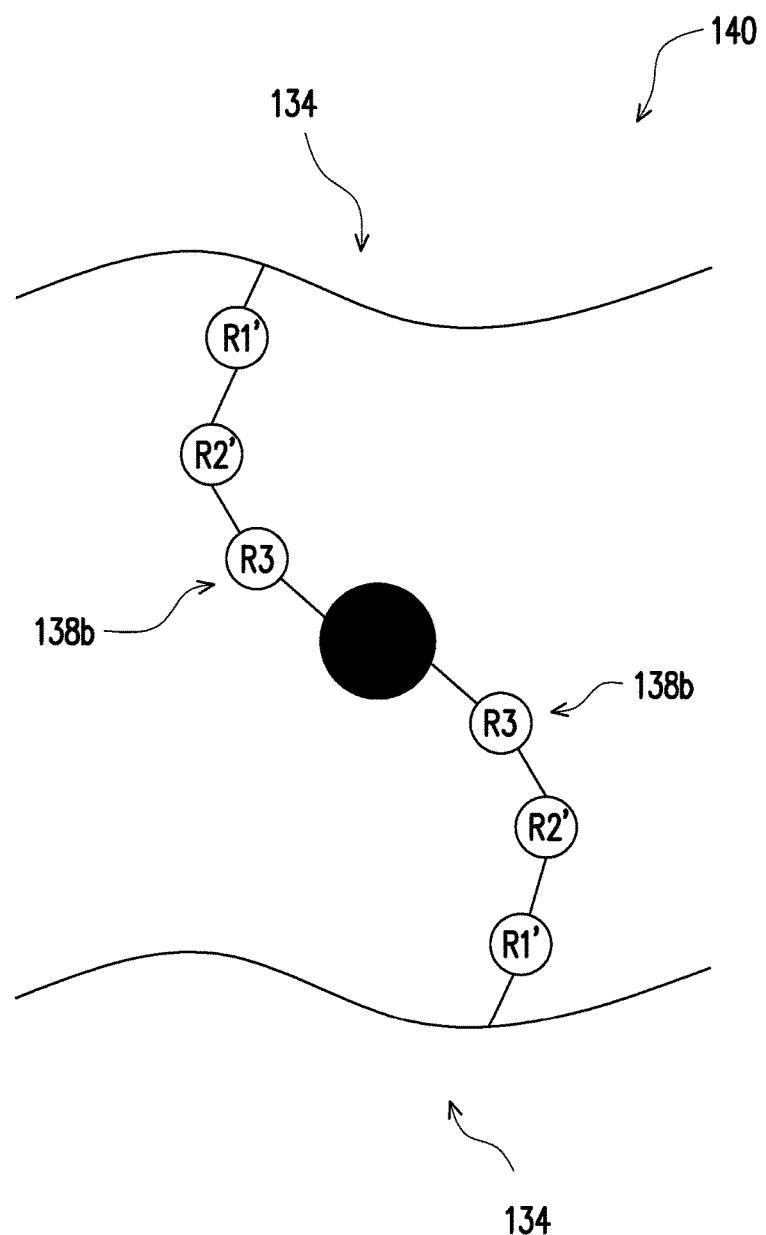
FIG. 2B is a schematic view of an under layer in accordance with some embodiments of the disclosure.

After coating on the dielectric layer 120, a curing process is performed on the layer of the under layer composition 130, so as to form the under layer 140. During the curing process, the polymers 134 and the cross-linker 136 interact with each other to form the under layer 140 as illustrated in FIG. 2B. In detail, each crosslinkable functional group (R2) 138a of the cross-linker 136 is chemically bonded to the crosslinking site of the polymer 134, and thus the polymers 134 are crosslinked to form a crosslinked polymeric material. It is noted that as shown in FIG. 2B, the formed under layer 140 has the decomposable functional group (R3) 138b derived from the cross-linker 136. In some embodiments, the decomposable functional group (R3) 138b is exposed. Interactions between the polymer 134 and the cross-linker 136 may be represent as R1+R2-R3→R1'-R2'-R3. For example, when one of R1 and R2 is —OH and the other is —OMe, R1'-R2' is —O—, and the byproduct is MeOH. Similarly, when one of R1 and R2 is —COOMe and the other is —NH$_2$, R1'-R2' is —CO—NH—, and the byproduct is MeOH, or when R1 and R2 are —SH, R1'-R2' is —S—S—, and the byproduct is $H_2$. The curing process may contain at least one of a thermal treatment, a photo treatment, and an irradiation treatment. The curing temperature (crosslinking temperature) of the thermal treatment ranges between about 100° C. and 400° C., such as between about 200° C. and 300° C. In one embodiment, the curing temperature may be about 250° C., for example. The photo treatment may be performed with a light of a wavelength ranging from about 10 nm to 1000 nm, such as 170 nm to 250 nm.

Referring to FIG. 1B, after performing the curing process, the under layer 140 is formed over the substrate 110. In some embodiments, the under layer 140 is formed directly on the dielectric layer 120. The under layer 140 may have a thickness ranging between 100 angstroms and 9000 angstroms. For example, the thickness of the under layer 140 can be about 500 angstroms. In another embodiment, the under layer 140 has a thickness ranging between about 1000 angstroms and 3500 angstroms. Further, the under layer 140 may have other parameters that fall within selected ranges. For example, the under layer 140 has a refractive index in a range between about 1 and 3, and an extinction coefficient (absorption value) κ in a range between about 0.01 and 1.0. Alternatively, the under layer 140 may have a refractive index of about 1.5 and an extinction coefficient of about 0.35.

Referring to FIG. 1B, a middle layer 150 is formed over the under layer 140. The middle layer 150 may be a silicon-containing layer designed to provide etch selectivity from the under layer 140. In some embodiments, the middle layer 150 functions an etch mask to transfer a pattern to the under layer 140. In alternative embodiments, the middle layer 150 is also designed to function as a bottom anti-reflective coating that reduces reflection during a lithography exposure process, thereby increasing the imaging contrast and enhancing the imaging resolution. In some embodiments, the formation of the middle layer 150 includes spin-on coating and curing (such as a thermal treatment with a suitable baking temperature). In some embodiments, the middle layer 150 includes a silicon-containing organic polymer. The silicon-containing organic polymer may be crosslinked. In alternative embodiments, the middle layer 150 may include a silicon-containing inorganic polymer. For example, the inorganic polymeric material may include silicon oxide, silicon nitride or silicon oxynitride. The middle layer 150 may include pure silicon such as polycrystalline silicon or silicon oxide. For example, the middle layer 150 may include spin-on glass (SOG) known in the art. The middle layer may include a metal-containing organic polymer material that contains metal such as titanium, titanium nitride, aluminum, and tantalum. The middle layer 150 may have a thickness ranging between about 100 and 1000 angstroms, or alternatively a range between about 150 and 300 angstroms.

Referring to FIG. 1B, a patterned photoresist layer 160 is then formed over the middle layer 150. In some embodiments, the patterned photoresist layer 160 includes at least one opening, such that portion of the middle layer 150 is uncovered within the opening, for example. The opening of the patterned photoresist layer 160 is configured according to a predetermined pattern. The patterned photoresist layer 160 may have a thickness ranging between about 50 angstroms and 5000 angstroms. Alternatively, the patterned photoresist layer 160 may have a thickness ranging between about 500 angstroms and 3000 angstroms, or ranging between about 1000 angstroms and 1500 angstroms. The patterned photoresist layer 160 can be a positive-type resist or a negative-type resist. For advanced semiconductor patterning using an extreme ultraviolet (EUV) radiation beam, the patterned photoresist layer 160 may use a chemical amplification (CA) resist. The patterned photoresist layer 160 is formed by a lithography process that may include processing steps of resist coating, soft baking, mask aligning, exposing, post-exposure baking, developing, and hard baking. For illustration, the exposing process may be carried out by exposing the semiconductor device under a radiation beam through a mask having a predefined pattern (or a reversed pattern). The radiation beam may be ultraviolet (UV) or EUV, such as a 248 nm beam from a Krypton Fluoride (KrF) excimer laser, or a 193 nm beam from an Argon Fluoride (ArF) excimer laser. The lithography process may utilize other exposing modes or technologies, such as on-axis, off-axis, quadripole, or dipole exposure technologies. The lithography patterning may alternatively be implemented or replaced by other proper methods such as maskless lithography, electron-beam writing, ion-beam writing, and molecular imprint techniques. The patterned photoresist layer 160 may include acid molecular or radiation-sensitive acid generator, such that acid can be generated when a radiation beam is applied. The patterned photoresist layer 160 may be further processed using a hardening process. The hardening process may include plasma treatment, ultraviolet (UV) curing, ion implant bombard, e-beam treatment, or combinations thereof.

Figure 1C:
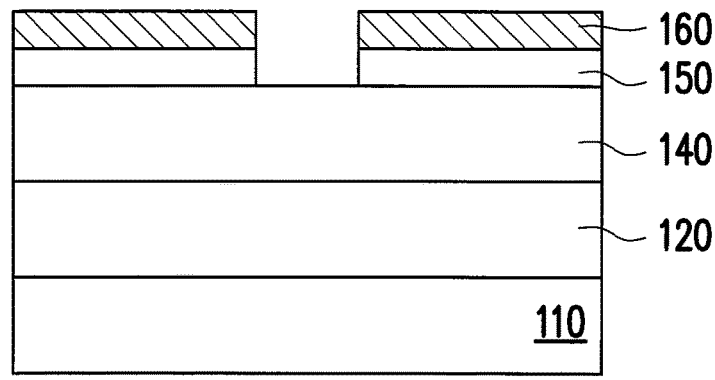
Figure 1D:
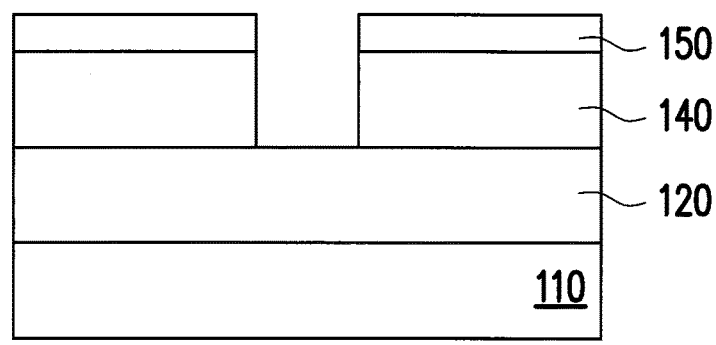
Figure 1E:
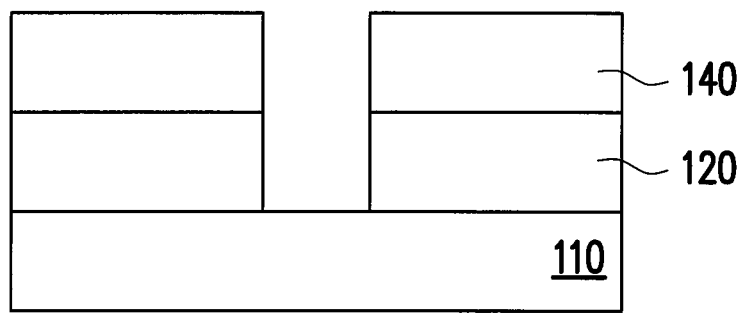

Referring to FIGS. 1C-1E, in some embodiments, a pattern of the under layer 140 is transferred to the dielectric layer 120. First, as shown in FIG. 1C, an etching process is applied to the middle layer 150 using the patterned photoresist layer 160 as an etch mask, thereby transferring the pattern from the patterned photoresist layer 160 to the middle layer 114. In some embodiments, the etching process may include dry etching, wet etching or a combination thereof. In the present example, the dry etching process includes a plasma etching process using an etchant having fluorine, such as $CF_2$, $CF_3$, $CF_4$, $C_2F_2$, $C_2F_3$, $C_3F_4$, $C_4F_4$, $C_4F_6$, $C_5F_6$, $C_6F_6$, $C_6F_8$, or a combination thereof. The wet etching may be a buffered hydrofluoric acid (BHF) wet etch to etch silicon dioxide in various examples.

Referring to FIGS. 1C and 1D, after the middle layer 150 is patterned by the etching process, the patterned photoresist layer 160 is removed. The patterned photoresist layer 160 may be removed by a proper technique, such as wet stripping or plasma ashing.

Referring to FIG. 1D, an etching process is applied to the under layer 140 using the patterned middle layer 150 as an etch mask, thereby transferring the pattern from the patterned middle layer 150 to the under layer 140. In some embodiments, the etching process may include dry etching, wet etching or a combination thereof, with an etchant selectively etching the under layer 140 while the middle layer 150 substantially survives. For example, if the middle layer 150 is a silicon-containing material while the under layer 140 is a silicon-free material, the etching selectivity can be achieved through proper choice of the etchant. The etching process may include a plasma etching process using an etchant having a sulfur-containing gas and an oxygen-containing gas. In one example, the oxygen-containing gas includes oxygen ($O_2$). In one example, the sulfur-containing gas includes carbonyl sulfide (COS). In another example, the sulfur-containing gas includes sulfur dioxide ($SO_2$).

Referring to FIGS. 1D and 1E, after the under layer 140 is patterned by the etching process, the patterned middle layer 150 may be removed by a proper technique. In some embodiments, the patterned middle layer 150 may be removed by dry etching, wet etching such as using sulfuric peroxide mixture (SPM), ammonia peroxide mixture (APM or SC-1), a diluted hydrofluoric acid (DHF) or a combination thereof. In alternative embodiments, through proper choice of the etchant based on the material of the patterned photoresist layer 160 and the patterned middle layer 150, the patterned photoresist layer 160 and the patterned middle layer 150 may be removed concurrently.

Referring to FIG. 1E, an etching process is applied to the dielectric layer 120 using the patterned under layer 140 as an etch mask, thereby transferring the pattern from the patterned under layer 140 to the dielectric layer 120. The etching process is dry etching, wet etching, or a combination thereof.

Figure 1F:
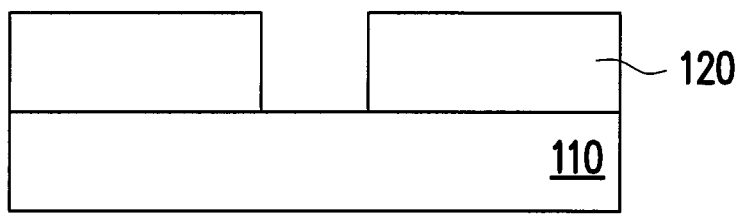
Figure 2C:
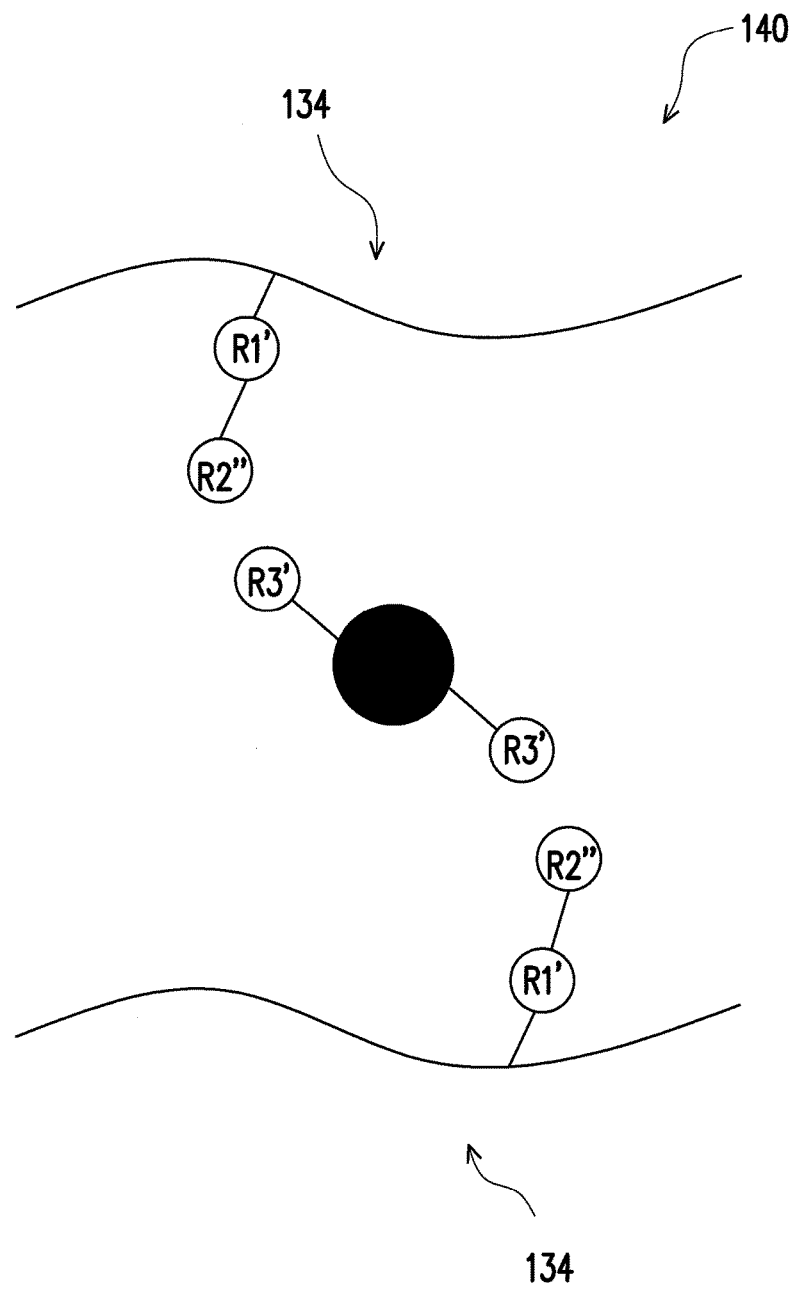
FIG. 2C is a schematic view of an under layer under a condition of pH 4~10 in accordance with some embodiments of the disclosure.

Referring to FIGS. 1F and 2C, the under layer 140 is removed under a condition of pH 4~10. As shown in FIG. 2C, under a condition of pH 4~10 as using a wet solution, the decomposable functional group (R3) 138$b$ of the crosslinked polymeric material is decomposed, and thus the crosslinked polymers 134 are decrosslinked. Accordingly, the under layer 140 is easily stripped. Decomposition of the decomposable functional group (R3) 138$b$ involves a bond cleavage (bond broken), and may be represent as R1'-R2'-R3→R1'-R2''+R3'. For example, R3 is —COO, and R3' is —COOH. The bond may be broken by hydrolysis, but the disclosure is not limited thereto. Since the decrosslinked polymeric material has a smaller size than the crosslinked polymeric material, the wet solution not only weakens the structure of the under layer 140 but removes the under layer 140. In some embodiments, pH of the condition is about 4, 5, 6, 7, 8, 9, 10, including any range between any two of the preceding values. In some embodiments, the wet solution is a weak acid or base solution, and includes base or acid solute in a solvent. The solvent may be an organic solvent, water or a combination thereof. In the combined solvents, amount of the organic solvent is less than 50%, and amount of water is larger than 50%, for example. In some embodiments, the wet solution has pH 6~8. A temperature of the wet solution ranges from room temperature to 70° C. In one embodiment, pH of the wet solution is about 8, and the temperature of the wet solution is about 50° C. In addition, the wet solution has at least 70% water.

Figure 3A:
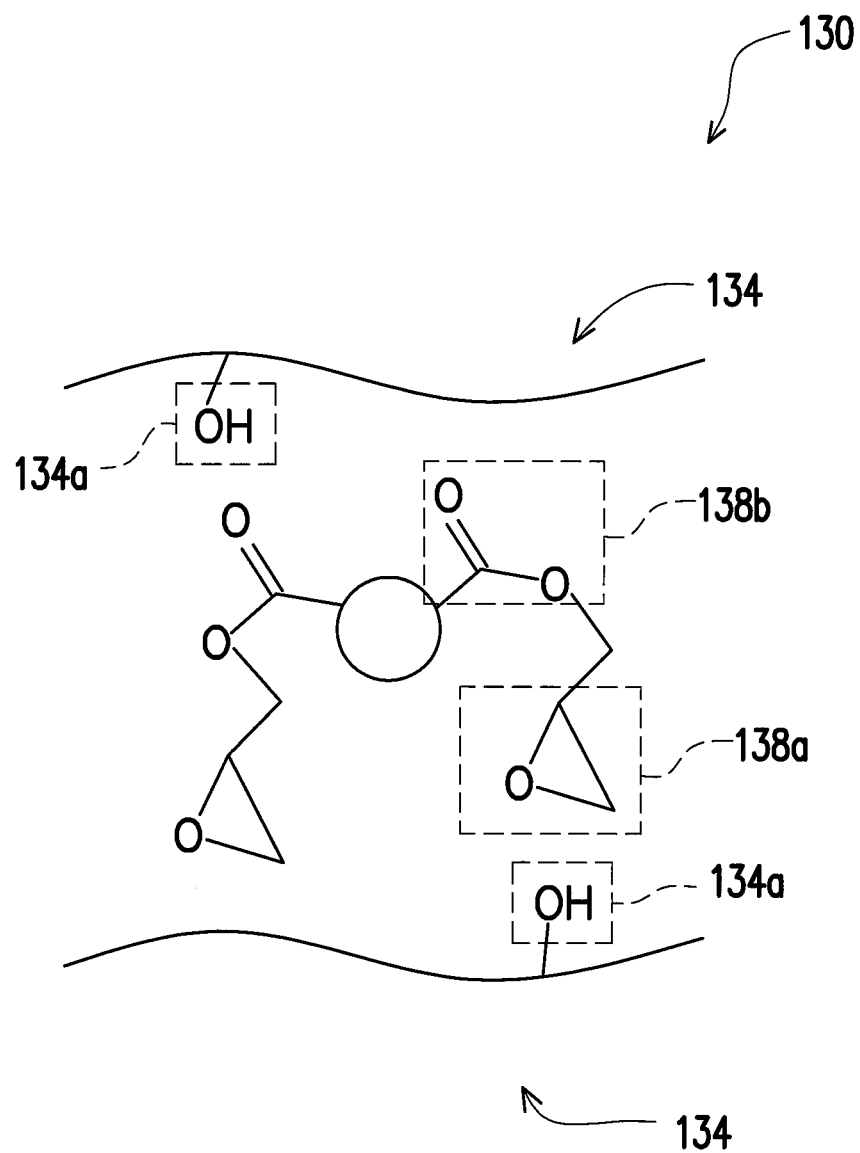
FIG. 3A is a schematic view of an under layer composition in accordance with some embodiments of the disclosure.
Figure 3B:
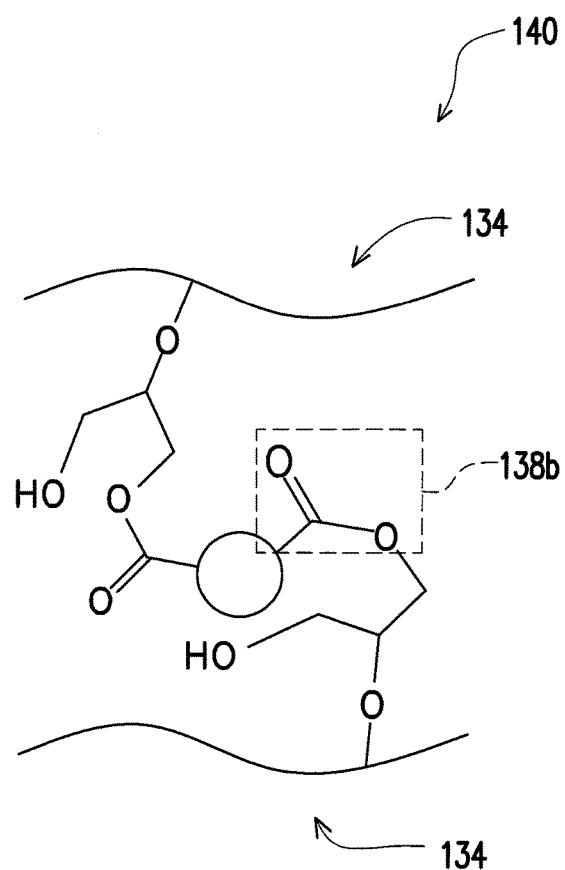
FIG. 3B is a schematic view of an under layer in accordance with some embodiments of the disclosure.
Figure 3C:
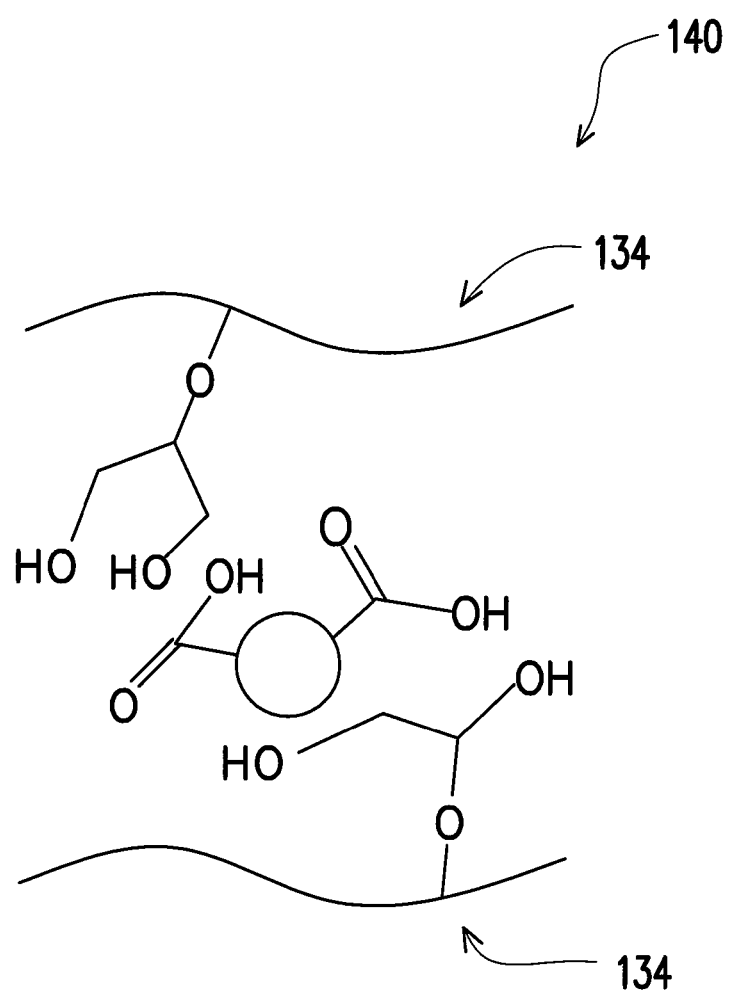
FIG. 3C is a schematic view of an under layer under a condition of pH 4~10 in accordance with some embodiments of the disclosure.

For a better understanding of the embodiments of the disclosure, an example of the under layer composition is illustrated in FIG. 3A, and FIGS. 3B and 3C respectively show an under layer formed by the under layer composition of FIG. 3A and the under layer of FIG. 3B under a condition of pH 4~10. Referring to FIG. 3A, the under layer composition 130 includes a plurality of polymers 134 and a cross-linker 136. In the present embodiment, the reaction group 134$a$ is a hydroxyl group (—OH), the crosslinkable functional group 138$a$ is an epoxy group, and the decomposable functional group 138$b$ is a carboxyl group (—COO). Referring to FIG. 3B, after the curing process, —O— bond is formed to crosslink the polymers 134 and the cross-linker 136, and thus the under layer 140 has a crosslinked polymeric material. Referring to FIG. 3C, under a condition of pH 4~10, the decomposable functional group 138$b$ is decomposed, and thus the crosslinked polymeric material is decrosslinked to form a plurality of polymers 134.

In some embodiments, the under layer has a crosslinked polymeric material with a decomposable functional group, which is derived from the cross-linker and has a weak chemical stability. Therefore, under a condition of pH 4~10 such as using a mild wet solution, the decomposable functional group is decomposed and the crosslinked polymeric material is decrosslinked. Accordingly, the under layer is easily removed by the mild wet solution. In addition, compared with the dry etching process, since the under layer is removed under a mild wet solution, damage to the material layer such as a low-k dielectric layer beneath the under layer is prevented. Thus, the reliability or performance of the semiconductor device is improved.

In accordance with some embodiments of the present disclosure, an under layer composition includes a polymeric material and a cross-linker. The polymeric material includes at least one reaction group. The cross-linker includes at least one crosslinkable functional group and at least one decomposable functional group, the at least one crosslinkable functional group is capable of crosslinking with the at least one reaction group of the polymeric material, and the decomposable functional group is capable of being decomposed under a condition of pH 4~10.

In accordance with some embodiments of the present disclosure, a method of manufacturing a semiconductor device includes at least the following steps. A layer of an under layer composition is formed, wherein the under layer composition includes a polymeric material and a cross-linker, and the cross-linker includes at least one decomposable functional group. A curing process is performed on the layer of the under layer composition to form an under layer, wherein the cross-linker is crosslinked with the polymeric material to form a crosslinked polymeric material having the at least one decomposable functional group. A patterned photoresist layer is formed over the under layer. An etching process is performed to transfer a pattern of the patterned photoresist layer to the under layer. The under layer is removed by decomposing the decomposable functional group.

In accordance with some embodiments of the present disclosure, a method of manufacturing a semiconductor device includes at least the following steps. An under layer is formed over a dielectric layer, wherein the under layer includes a crosslinked polymeric material including at least one decomposable functional group. A patterned photoresist layer is formed over the under layer. A first etching process is performed to transfer a pattern of the patterned photoresist layer to the under layer. A second etching process is performed to transfer the pattern to the dielectric layer by using the under layer as a mask. The under layer is removed by decrosslinking the crosslinked polymeric material through the at least one decomposable functional group.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a layer of an under layer composition, wherein the under layer composition comprises a polymeric material and a cross-linker, and the cross-linker comprises at least one decomposable functional group;
    performing a curing process on the layer of the under layer composition to form an under layer, wherein the cross-linker is crosslinked with the polymeric material to form a crosslinked polymeric material having the at least one decomposable functional group;

forming a patterned photoresist layer over the under layer;
performing an etching process to transfer a pattern of the patterned photoresist layer to the under layer; and
removing the under layer by decomposing the decomposable functional group.

2. The method according to claim 1, wherein the polymeric material comprises at least one reaction group providing a crosslinking site, the at least one reaction group is selected from the group consisting of a hydroxyl group, an alkoxyl group having a carbon number less than 6, an amine group, a thiol group, a ester group, an alkene group, an alkyne group, an epoxy group, an aziridine group, an oxetane group, an aldehyde group, a ketone group, and a carboxylic acid group.

3. The method according to claim 1, wherein the cross-linker comprises at least one crosslinkable functional group, and the at least one crosslinkable functional group is selected from the group consisting of a hydroxyl group, an alkoxyl group having a carbon number less than 6, an amine group, a thiol group, a ester group, an alkene group, an alkyne group, an epoxy group, an aziridine group, an oxetane group, an aldehyde group, a ketone group, and a carboxylic acid group.

4. The method according to claim 1, wherein the at least one decomposable functional group of the cross-linker is selected from the group consisting of an ester group, an ether group, a silyl ether group, an acetal group, a ketal group, an amide group, an imine group, an imide group, and a carbamate group.

5. The method according to claim 1, wherein the curing process is performed at a temperature ranging between about 100° C. and 400° C.

6. The method according to claim 1, further comprising forming a middle layer between the under layer and the patterned photoresist layer.

7. The method according to claim 1, wherein in the step of decomposing the decomposable functional group, a bond in the at least one decomposable functional group is broken.

8. The method according to claim 1, wherein removing the under layer is performed under a condition of pH 4~10.

9. The method according to claim 1, wherein removing the under layer is performed under a condition of pH 6~8.

10. A method of manufacturing a semiconductor device, comprising:
forming an under layer over a dielectric layer, wherein the under layer comprises a crosslinked polymeric material comprising at least one decomposable functional group;
forming a patterned photoresist layer over the under layer;
performing a first etching process to transfer a pattern of the patterned photoresist layer to the under layer;
by using the under layer as a mask, performing a second etching process to transfer the pattern to the dielectric layer; and
removing the under layer by decrosslinking the crosslinked polymeric material through the at least one decomposable functional group.

11. The method according to claim 10, wherein the at least one decomposable functional group is selected from the group consisting of an ester group, an ether group, a silyl ether group, an acetal group, a ketal group, an amide group, an imine group, an imide group, and a carbamate group.

12. The method according to claim 10, wherein the under layer is formed directly on the dielectric layer.

13. The method according to claim 10, wherein the dielectric layer is a low-k dielectric layer.

14. The method according to claim 10, wherein removing the under layer is performed under a condition of pH 4~10.

15. The method according to claim 10, wherein removing the under layer is performed under a condition of pH 6~8.

16. A method of manufacturing a semiconductor device, comprising:
forming a layer of an under layer composition, wherein the under layer composition comprises a polymeric material and a cross-linker, the polymeric material comprises at least one reaction group, the cross-linker comprises at least one crosslinkable functional group and at least one decomposable functional group, the at least one crosslinkable functional group is capable of crosslinking with the at least one reaction group of the polymeric material, and the decomposable functional group is capable of being decomposed under a condition of pH 4~10;
performing a curing process on the layer of the under layer composition to form an under layer, wherein the cross-linker is crosslinked with the polymeric material to form a crosslinked polymeric material having the at least one decomposable functional group;
forming a patterned photoresist layer over the under layer;
performing an etching process to transfer a pattern of the patterned photoresist layer to the under layer; and
removing the under layer by decomposing the decomposable functional group.

17. The method according to claim 16, wherein the at least one reaction group of the polymeric material is selected from the group consisting of a hydroxyl group, an alkoxyl group having a carbon number less than 6, an amine group, a thiol group, a ester group, an alkene group, an alkyne group, an epoxy group, an aziridine group, an oxetane group, an aldehyde group, a ketone group, and a carboxylic acid group.

18. The method according to claim 16, wherein the at least one crosslinkable functional group of the cross-linker is selected from the group consisting of a hydroxyl group, an alkoxyl group having a carbon number less than 6, an amine group, a thiol group, a ester group, an alkene group, an alkyne group, an epoxy group, an aziridine group, an oxetane group, an aldehyde group, a ketone group, and a carboxylic acid group.

19. The method according to claim 16, wherein the at least one decomposable functional group of the cross-linker is selected from the group consisting of an ester group, an ether group, a silyl ether group, an acetal group, a ketal group, an amide group, an imine group, an imide group, and a carbamate group.

20. The method according to claim 16, wherein the decomposable functional group is capable of being decomposed under a condition of pH 6~8.

* * * * *